US010635123B2

(12) United States Patent
Kim (10) Patent No.: US 10,635,123 B2
(45) Date of Patent: Apr. 28, 2020

(54) DEVICE FOR ELIMINATING SLOPE IN OUTPUT VOLTAGE OF SWITCHER POWER CONVERTER IN PLC MODULE

(71) Applicant: LSIS CO., LTD., Anyang-si, Gyeonggi-do (KR)

(72) Inventor: Jung-Wook Kim, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/257,747

(22) Filed: Jan. 25, 2019

(65) Prior Publication Data

US 2019/0235541 A1  Aug. 1, 2019

(30) Foreign Application Priority Data

Jan. 30, 2018 (KR) .................. 10-2018-0011091

(51) Int. Cl.
| | |
|---|---|
| H02M 3/156 | (2006.01) |
| G05F 1/46 | (2006.01) |
| H02M 1/36 | (2007.01) |
| G05F 3/18 | (2006.01) |
| G06F 1/26 | (2006.01) |
| H03K 5/24 | (2006.01) |
| H02M 1/00 | (2006.01) |

(52) U.S. Cl.
CPC ............... *G05F 1/465* (2013.01); *G05F 3/18* (2013.01); *G06F 1/26* (2013.01); *H02M 1/36* (2013.01); *H02M 3/156* (2013.01); *H03K 5/24* (2013.01); *H02M 2001/0022* (2013.01)

(58) Field of Classification Search
None
See application file for complete search history.

(56) References Cited

U.S. PATENT DOCUMENTS

| | | | | |
|---|---|---|---|---|
| 5,465,188 A | * | 11/1995 | Pryor | H02H 3/087 361/18 |
| 2008/0247110 A1 | * | 10/2008 | Yamamoto | H02H 3/24 361/92 |
| 2009/0052653 A1 | * | 2/2009 | Ding | H04M 1/66 379/401 |

(Continued)

FOREIGN PATENT DOCUMENTS

| | | | |
|---|---|---|---|
| CN | 202043053 U | * | 11/2011 |
| CN | 202043053 U | | 11/2011 |

(Continued)

OTHER PUBLICATIONS

European Search Report for related European Application No. 19153826.3; action dated Jun. 19, 2019; (7 pages).

*Primary Examiner* — Jeffrey A Gblende
(74) *Attorney, Agent, or Firm* — K&L Gates LLP (57) ABSTRACT

The present disclosure provides a device for eliminating a slope in an output voltage of a switcher power converter of a PLC module, by which a power supply timing of an internal regulator circuit applied to a PLC power supply is secured and an initial start condition (specification) required by the circuit element is satisfied by eliminating a slope phenomenon occurring in an output voltage from the internal regulator circuit when an external input voltage to the PLC module increases or decreases gradually.

7 Claims, 8 Drawing Sheets

(56) References Cited

U.S. PATENT DOCUMENTS

| | | | |
|---|---|---|---|
| 2009/0243870 A1* | 10/2009 | Dai | H02H 3/20 340/662 |
| 2011/0050203 A1* | 3/2011 | Huang | G01R 19/16523 324/76.11 |
| 2012/0133350 A1 | 5/2012 | Yang | |

FOREIGN PATENT DOCUMENTS

| | | |
|---|---|---|
| JP | S59071521 A | 4/1984 |
| JP | 2000188862 A | 7/2000 |
| JP | 2006115594 A | 4/2006 |
| JP | 2009240025 A | 10/2009 |
| JP | 2012239278 A | 12/2012 |

\* cited by examiner

DEVICE FOR ELIMINATING SLOPE IN OUTPUT VOLTAGE OF SWITCHER POWER CONVERTER IN PLC MODULE

CROSS-REFERENCE TO RELATED APPLICATIONS

Pursuant to 35 U.S.C. § 119(a), this application claims the benefit of earlier filing date and right of priority to Korean Application No. 10-2018-0011091, filed on Jan. 30, 2018, in the Korean Intellectual Property Office, the disclosure of which is hereby incorporated by reference in its entirety.

BACKGROUND

1. Technical Field

The present disclosure relates to a PLC (Programmable Logic Controller) power module. Specifically, the present disclosure relates to a device for eliminating a slope in an output voltage from a switching regulator applied to a PLC power module.

2. Description of the Related Art

A Programmable Logic Controller (PLC) has built-in functions such as numerical operation, logic operation, sequencing control, timer, and counter, and has a memory that may store programs and various data. The PLC is a special computer that can control various automation machines and processors. Therefore, the PLC may be applied to various tasks such as device control, device numerical setting, time control, real-time monitoring, real-time data collection and safety device operation, etc.

The PLC is equipped with an analog output module to provide signals to machines such as automation equipment and an analog input module to receive signals from the machine.

The analog input module converts the analog signal provided by the machine into a digital signal and provides the converted digital signal to an internal arithmetic processing unit. The analog output module receives a digital signal reflecting an arithmetic processing result provided from the arithmetic processing unit, converts the digital signal into an analog signal, and transmits the converted analog signal to the machine.

In this connection, the PLC includes a power supply that supplies a power for the operations of the analog input module and analog output module. The power supply converts a power input from an outside into a power required for the operation of the analog input/output modules and supplies the converted power to the analog input/output modules.

Therefore, in order for the analog input/output modules to operate normally, the power supplied by the power supply must be kept stable at all times.

A switching regulator applied to the PLC's power supply receives a DC 24 [V] voltage and outputs a DC 5 [V] voltage. In this connection, the DC 24 [V] voltage may be supplied not only to the PLC but also to a peripheral device or relay element in a parallel manner.

In this case, the peripheral device or relay element has active elements such as inductance and capacitance elements. As a result, the DC 24 [V] power supplied to the PLC power supply may gradually decrease or increase gradually due to the characteristics of the active elements.

Figure 1A:
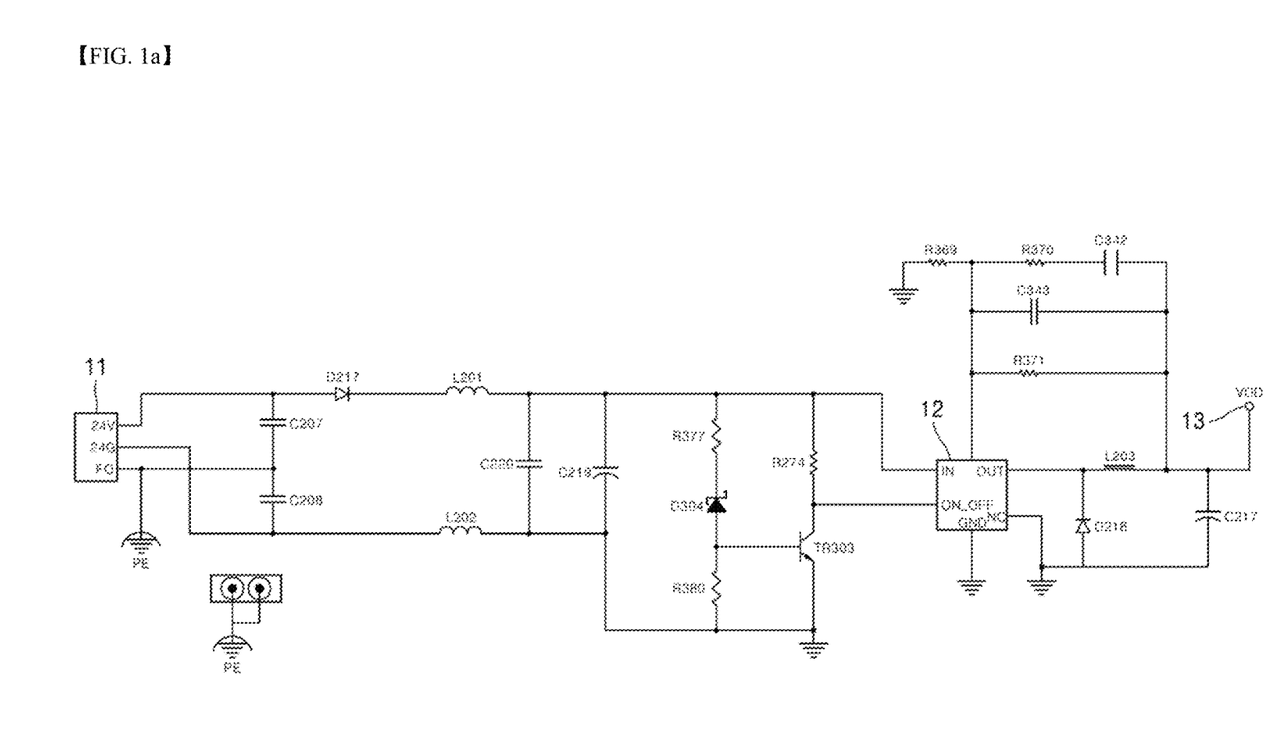
FIGS. 1a and 1b respectively show a circuit diagram of a switcher power converter used in a conventional PLC power supply, the converter including a LM2596 step-down regulator from Texas Instruments, and an output voltage waveform in a gradual increase of an input.
Figure 1B:
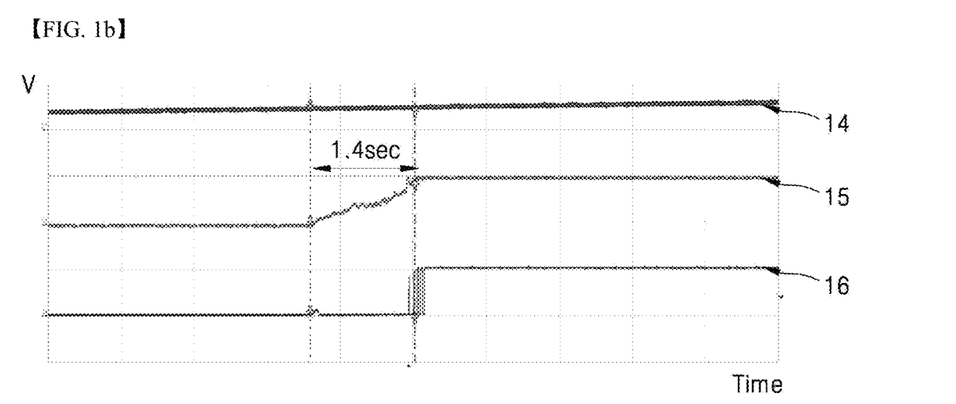
Figure 2A:
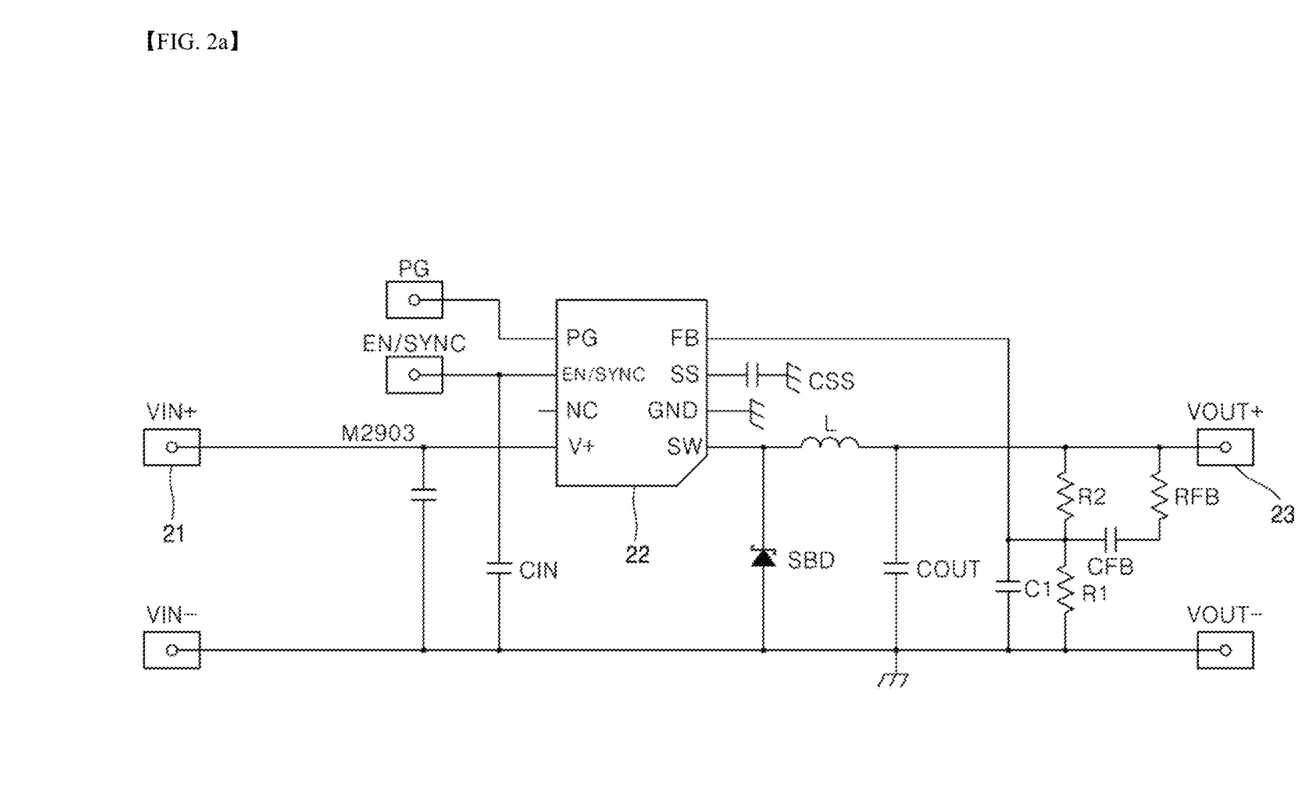
FIGS. 2a and 2b respectively show a circuit diagram of a switcher power converter used in a conventional PLC power supply, the converter including a NJW4196 step-down regulator from a NJR corporation, and an output voltage waveform in a gradual increase of an input.
Figure 2B:
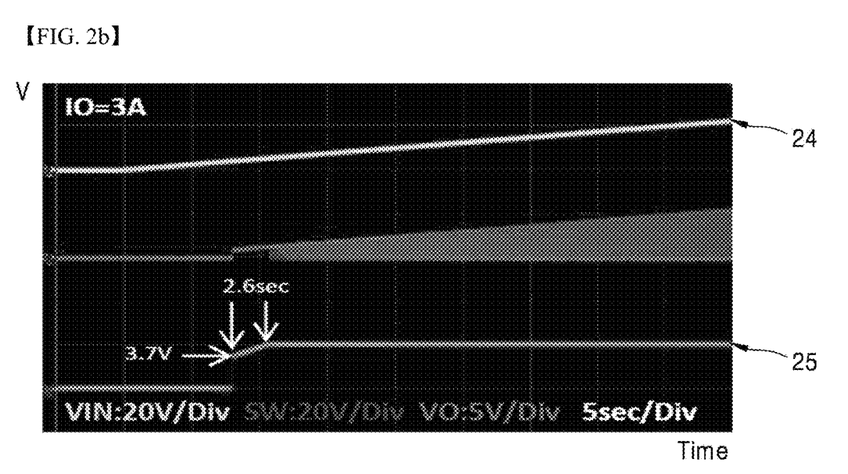

FIGS. 1a and 1b respectively show a circuit diagram of a switcher power converter used in a conventional PLC power supply, the converter including a LM2596 step-down regulator from Texas Instruments, and an output voltage waveform in a gradual increase of an input. FIGS. 2a and 2b respectively show a circuit diagram of a switcher power converter used in a conventional PLC power supply, the converter including a NJW4196 step-down regulator from a NJR corporation, and an output voltage waveform in a gradual increase of an input.

As shown in the figures, when an input voltage of an external DC 24 [V] input stage 11 or 21 is gradually increased from DC 0 [V] to DC 24 [V], as indicated by a reference numeral 14 or 24, an output voltage of DC 5 [V] is output to an output stage 13 or 23 via a regulator 12 or 22. In this connection, a time taken for the external input stage's input voltage to increase from DC 0 [V] to DC 24 [V] is 60 seconds.

The regulator 12 shown in FIG. 1a is a Texas Instruments LM2596 step-down switching regulator capable of driving a 3 A load and is a monolithic integrated circuit. The regulator 12 outputs a DC 5 [V] fixed voltage. Further, the regulator 22 shown in FIG. 2a is a NJW4196 buck converter with a MOSFET available from a NJR corporation that can drive a 3.5 A load. The regulator 22 has a stable regulation function and outputs DC 5 [V] voltage.

In this connection, an waveform of the output voltage of DC 5 [V] supplied to the PLC module internal circuit from the output stage 13 or 23 has a slope phenomenon as in the waveform shown at the reference numeral 15 or 25 as the input voltage is incrementally increased from DC 0 [V] to DC 24 [V].

Due to the slope phenomenon in the output voltage, a rising time is required for which the voltage output from the regulator 12 or 22 rises to the DC 5 [V] level.

The regulator 12 in FIG. 1a exhibits the output voltage waveform 15 shown in FIG. 1b, and it may be seen that the rising time thereof is 1.4 seconds. In this connection, a vertical axis represents a voltage V, while a horizontal axis represents a time. The regulator 22 in FIG. 2a exhibits the output voltage waveform 25 shown in FIG. 2b, and it may be seen that the rising time thereof is 2.6 seconds. In this connection, the vertical axis represents a voltage V, while a horizontal axis represents a time.

In this way, as the input voltage gradually increases and decreases, a level and timing of the output voltage inside the circuit becomes unstable when the initial power is applied. When this unstable voltage is supplied to the analog input/output modules, the analog input/output modules cannot receive or output an accurate analog signal. Thus, when an element constituting the internal circuit in the PLC module requires a power on/off sequence and a constant power input timing, the element may malfunction. This causes a product quality and performance to deteriorate.

Figure 3:
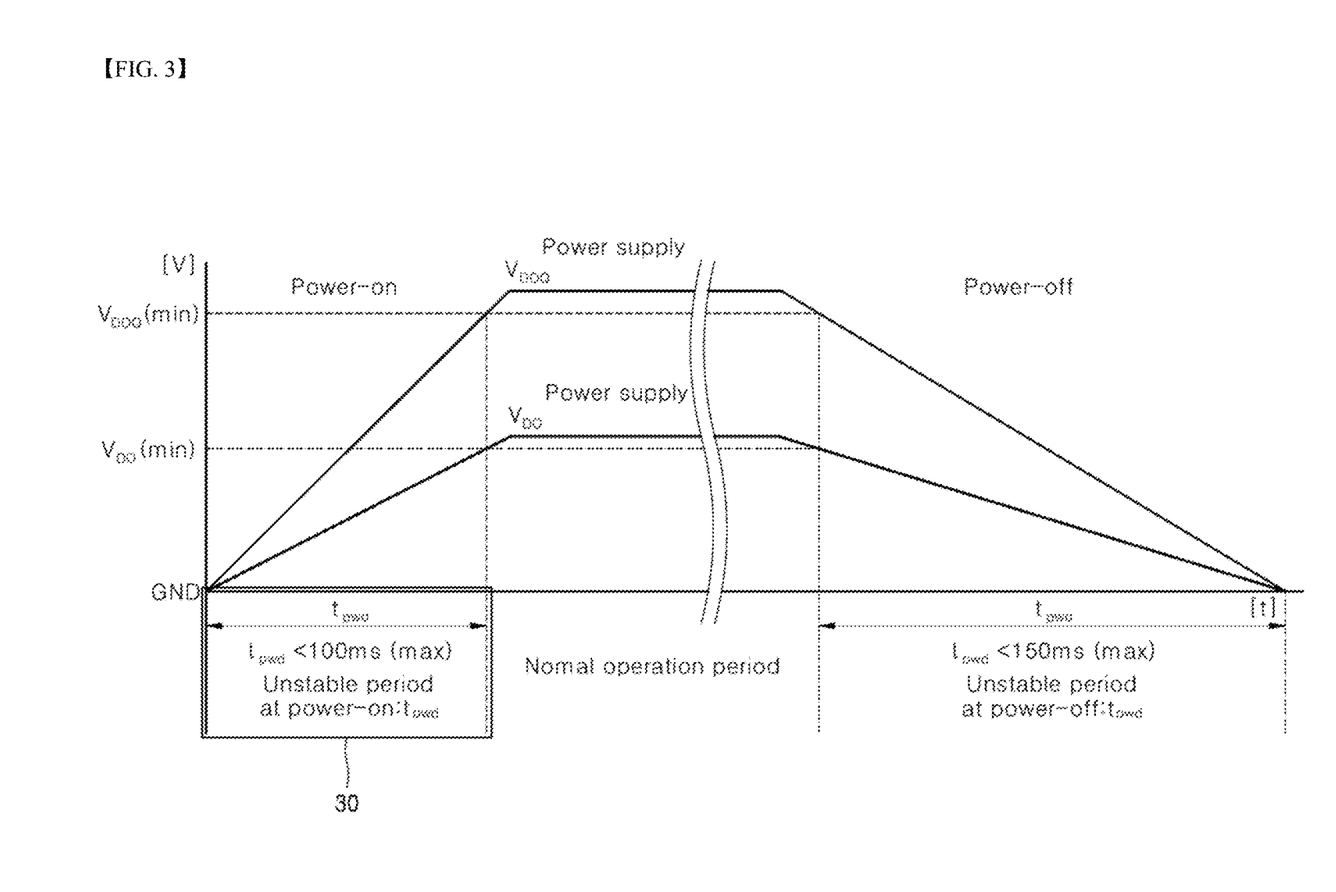
FIG. 3 shows a power input process in a conventional MPU SH7750.

In one example, a MPU SH7750 as one of the internal elements in the PLC module requires a power supply rising time thereof to be a standard 30 within 100 [ms] ion the power inputting process of SH7750 as shown in FIG. 3.

Further, at the initial power application, a reset voltage of each MPU connected to a load stage repeatedly becomes on→off→on as in the output voltage waveform of the reference numeral 16 shown in FIG. 1b, based on characteristics of an element having the inductance and the capacitance component in a 5V load stage. Accordingly, the circuit connected to the load stage may perform an abnormal operation.

SUMMARY

A purpose of the present disclosure is to provide a device for eliminating a slope in an output voltage of a switcher power converter of a PLC module, by which a power supply timing of an internal regulator circuit applied to a PLC power supply is secured and an initial start condition (specification) required by the circuit element is satisfied by eliminating a slope phenomenon occurring in an output voltage from the internal regulator circuit when an external input voltage to the PLC module increases or decreases gradually.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In one aspect of the present disclosure, there is provided a switcher power converter for a programmable logic controller (PLC) module, characterized in that the power converter has an output voltage without a slope, the converter comprising: an input voltage correction unit configured to correct a gradually increasing external input voltage such that the gradually increasing external input voltage is output only when the gradually increasing external input voltage is greater than or equal to a reference voltage; and a regulator configured to receive the corrected external input voltage output from the input voltage correction unit and to supply a fixed output voltage to an internal circuit in the PLC module.

In one embodiment, the input voltage correction unit includes: an input stage distribution unit configured to control an amplification factor of the external input voltage so that a difference between an input and an output to allow the regulator to generate a voltage is generated; a constant voltage generation unit configured to convert the gradually increasing external input voltage into a constant voltage, wherein the constant voltage is not increased beyond a certain voltage value but is kept at the certain voltage value; and a voltage comparison unit configured to, when a voltage output from the input stage distribution unit is greater than a voltage output from the constant voltage generation unit, output the gradually-increasing external input voltage supplied at a current output time.

In one embodiment, the input voltage correction unit includes: an input stage distribution unit including a first resistor and a second resistor connected in series, wherein the first resistor and the second resistor are connected to input stages respectively; a constant voltage generation unit including a third resistor and a Zener diode connected in series with each other, wherein the third resistor and the Zener diode are connected to the input stages respectively; and a voltage comparison unit including a comparator, where the comparator has a positive terminal connected to a node between the first resistor and the second resistor of the input stage distribution unit, and a negative terminal connected to a node between the third resistor and the Zener diode of the constant voltage generation unit.

In one embodiment, the input stage distribution unit changes values of the first resistor and the second resistor to control an amplification factor of the external input voltage applied from the input stages such that a difference between an input and an output to allow the regulator to generate a voltage is generated.

In one embodiment, the constant voltage generation unit converts and maintains the gradually increasing external input voltage applied from the input stages to a specific voltage value based on a Zener voltage of the Zener diode.

In one embodiment, the negative terminal of the voltage comparison unit is maintained at a specific voltage value by the constant voltage generation unit, wherein the gradually increasing external input voltage is applied to the positive terminal of the voltage comparison unit based on an amplification factor by the input stage distribution unit.

In one embodiment, an initial external input voltage applied to the positive terminal of the voltage comparison unit has a voltage value smaller than the specific voltage value held at the negative terminal of the voltage comparison unit.

In one embodiment, when a voltage of the positive terminal of the voltage comparison unit is gradually increased to be greater than a voltage of the negative terminal of the voltage comparison unit, the voltage comparison unit outputs, to the regulator, the gradually increasing external input voltage supplied at a current output time.

In one embodiment, the external input voltage output from the voltage comparison unit is input to an enable terminal of the regulator.

According to the present disclosure as described above, the device that eliminates the slope phenomenon of the output voltage of the switcher power converter for the PLC module may output the gradually increasing external input voltage only when the external input voltage is above or equal to the reference voltage, thereby to remove the slope phenomenon occurring in the output voltage of the internal regulator circuit applied to the PLC power supply when the external input voltage increases or decreases gradually. Thus, the regulator allows the operation voltage level required by the circuit element to be ensured, and allows the operation timing to be stably provided. Thus, malfunction of the internal circuit may be prevented after the initial voltage application time in the PLC module.

In particular, supplying the output voltage with no slope phenomenon to the internal circuit may allow an operation voltage level required by the circuit element to be secured and allow an operation timing to be provided stably. Thus, this may prevent malfunction of the internal circuit after the initial voltage application time in the PLC module.

Further specific effects of the present disclosure as well as the effects as described above will be described in conduction with illustrations of specific details for carrying out the invention.

DETAILED DESCRIPTION

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Hereinafter, a device for eliminating a slope in an output voltage of a switcher power converter of a PLC module according to some embodiments of the present disclosure will be described with reference to FIGS. 4 to 8.

In this connection, in following embodiments, the circuit diagram of the switcher power converter applied to the PLC power supply includes the NJW4196 step-down regulator available from the NJR corporation. However, this is only an example for ease of illustration. The present disclosure is not limited thereto. For example, the circuit diagram of the switcher power converter applied to the PLC's power supply may include an LM2596 step-down regulator available from Texas Instruments. In general, the same technical considerations as described below may be applied to the circuit diagram including all regulators included in the switcher power converter applied to the PLC power supply.

Figure 4:
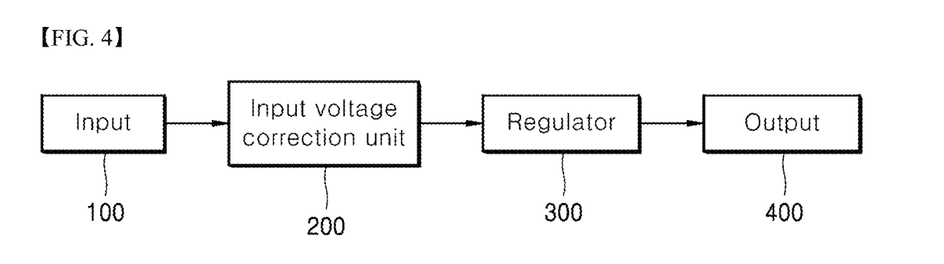
FIG. 4 shows a configuration of a switcher power converter having a device for eliminating a slope in an output voltage of the switcher power converter of a PLC module according to an embodiment of the present disclosure

FIG. 4 shows a configuration of a switcher power converter having a device for eliminating a slope in an output voltage of a switcher power converter of a PLC module according to an embodiment of the present disclosure.

As shown in FIG. 4, the switcher power converter having the output voltage slope removing function includes an input voltage correction unit 200 and a regulator 300.

The input voltage correction unit 200 corrects a gradually increasing external input voltage input from an input 100 to a to-be-outputted external input voltage that gradually increases from and above a reference voltage. In this connection, the external input voltage to be outputted is input to an enable terminal of the regulator 300 to control the operation of the regulator 300.

Further, the regulator 300 receives the corrected external input voltage output by the input voltage correction unit 200, and outputs to an output 400a a fixed output voltage to be supplied to the module internal circuit.

Figure 5:
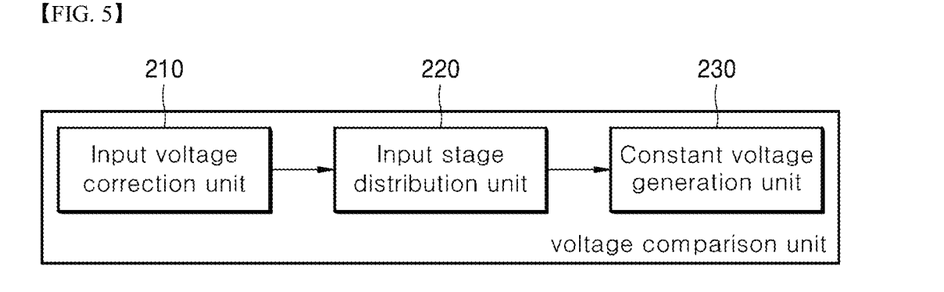
FIG. 5 is a block diagram detailing a configuration of a input voltage correction unit shown in FIG. 4.

FIG. 5 is a detailed block diagram of the configuration of the input voltage correction unit 200 shown in FIG. 4.

As shown in FIG. 5, the input voltage correction unit 200 includes an input stage distribution unit 210, a constant voltage generation unit 220, and a voltage comparison unit 230.

The input stage distribution unit 210 regulates an amplification factor of the external input voltage so that a difference between an input and an output to allow the regulator 300 to generate a voltage is generated. In this connection, depending on the type of regulator 300, the difference between the input and the output to allow the generator to generate the voltage varies. Accordingly, the controlled amplification factor of the voltage varies depending on the type of the regulator 300.

Further, the constant voltage generation unit 220 converts the gradually increasing external input voltage into a constant voltage which is not increased beyond a certain voltage value.

Further, the voltage comparison unit 230 compares the voltage output from the input stage distribution unit 210 with the voltage output from the constant voltage generation unit 220. When the voltage output from the input stage distribution unit 210 is greater than the voltage output from the constant voltage generation unit 220, the unit 239 outputs the supplied gradually-increasing external input voltage at the output time. In this connection, as the constant voltage generation unit 220 maintains a specific voltage value, the voltage output from the input stage distribution unit 210 is gradually increased from and above a value smaller than the specific voltage value.

Figure 6:
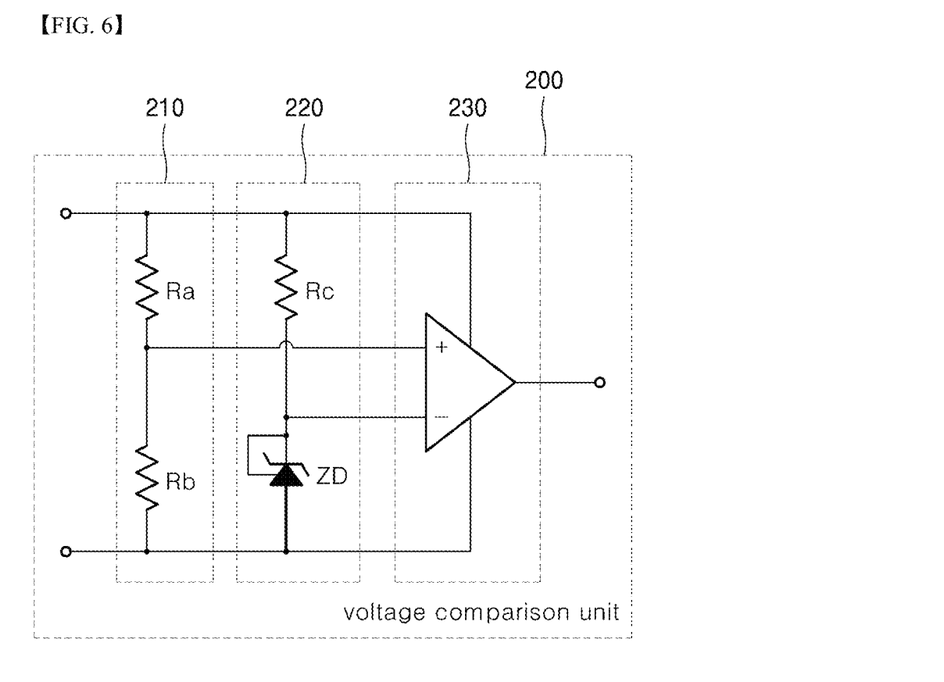
FIG. 6 shows a detailed circuit diagram of the input voltage correction unit shown in FIG. 5.

FIG. 6 is a detailed circuit diagram of the input voltage correction unit 200 shown in FIG. 5.

As shown in FIG. 6, the input voltage correction unit 200 includes the input stage distribution unit 210, the constant voltage generation unit 220, and the voltage comparison unit 230.

In this connection, the input stage distribution unit 210 includes a first resistor Ra and a second resistor Rb connected in series. The first resistor Ra and the second resistor Rb are connected to input stages VIN+ and VIN− of the input 100 respectively.

The first resistor Ra and the second resistor Rb of the input stage distribution unit 210 connected in series are connected to the input 100. The input stage distribution unit 210 changes values of the first resistor Ra and the second resistor Rb to control the amplification factor of the external input voltage applied to the input 100 such that a difference between an input and an output to allow the regulator 300 to generate a voltage is generated. Thus, the input stage distribution unit 210 controls the amplification factor of the voltage. In this connection, depending on the type of regulator 300, the difference between the input and the output to allow the generator to generate the voltage varies. Accordingly, the controlled amplification factor of the voltage varies depending on the type of the regulator 300.

The constant voltage generation unit 220 includes a third resistor Rc and a Zener diode ZD connected in series with each other. The third resistor Rc and the Zener diode ZD are connected to the input stages VIN+ and VIN− of the input 100, respectively.

The third resistor Rc and the Zener diode ZD of the constant voltage generation unit 220 are connected to the input 100. The constant voltage generation unit 220 generates a breakdown phenomenon to causes a reverse current to flow when the gradually increasing external input voltage applied from the input 100 exceeds a Zener voltage of the Zener diode ZD. As a result, the input voltage is maintained at a specific voltage value.

Further, the voltage comparison unit 230 is implemented as a comparator. A positive terminal of the voltage comparison unit 230 is connected to a node between the first resistor Ra and the second resistor Rb of the input stage distribution unit 210. A negative terminal of the voltage comparison unit 230 is connected to a node between the third resistor Rc and the Zener diode ZD of the constant voltage generation unit 220.

In other words, the voltage comparison unit 230 is implemented as a comparator. The voltage at the node between the first resistor Ra and the second resistor Rb of the input stage distribution unit 210 is applied to the positive terminal of the voltage comparison unit 230. The voltage at the node between the third resistor Rc and the Zener diode ZD of the constant voltage generation unit 220 is applied to the negative terminal of the voltage comparison unit 230. In this connection, the comparator compares magnitudes of the voltages applied to the negative and positive terminals. When the voltage applied to the positive terminal is greater than the voltage applied to the negative terminal (positive terminal voltage>negative terminal voltage), a comparator supply power VIN+ is output.

Therefore, even when a gradually increasing external input voltage is applied, the voltage applied to the negative terminal of the voltage comparison unit 230 is maintained at a specific voltage value by the constant voltage generation unit 220. Further, when the gradually increasing external input voltage is applied, the voltage applied to the positive terminal of the voltage comparison unit 230 is gradually increased from and above a value smaller than the specific voltage value held in the negative terminal and based on the amplification factor of the voltage controlled by the input stage distribution unit 210.

When the positive terminal voltage is gradually increased to be greater than the negative terminal voltage, the gradually increased external input voltage is output to the regulator 300 at a current output time. In this connection, the external input voltage output from the voltage comparison unit 230 is input to the enable terminal of the regulator 300 to control the operation of the regulator 300. Thus, the regulator may output an output voltage DC 5 [V] with no slope.

The regulator 300 supplies an output voltage having no slope to the internal circuit of the PLC module. Accordingly, the regulator 300 allows the operation voltage level required by the circuit element to be ensured, and allows the operation timing to be stably provided. Thus, malfunction of the internal circuit may be prevented after the initial voltage application time in the PLC module.

Figure 7A:
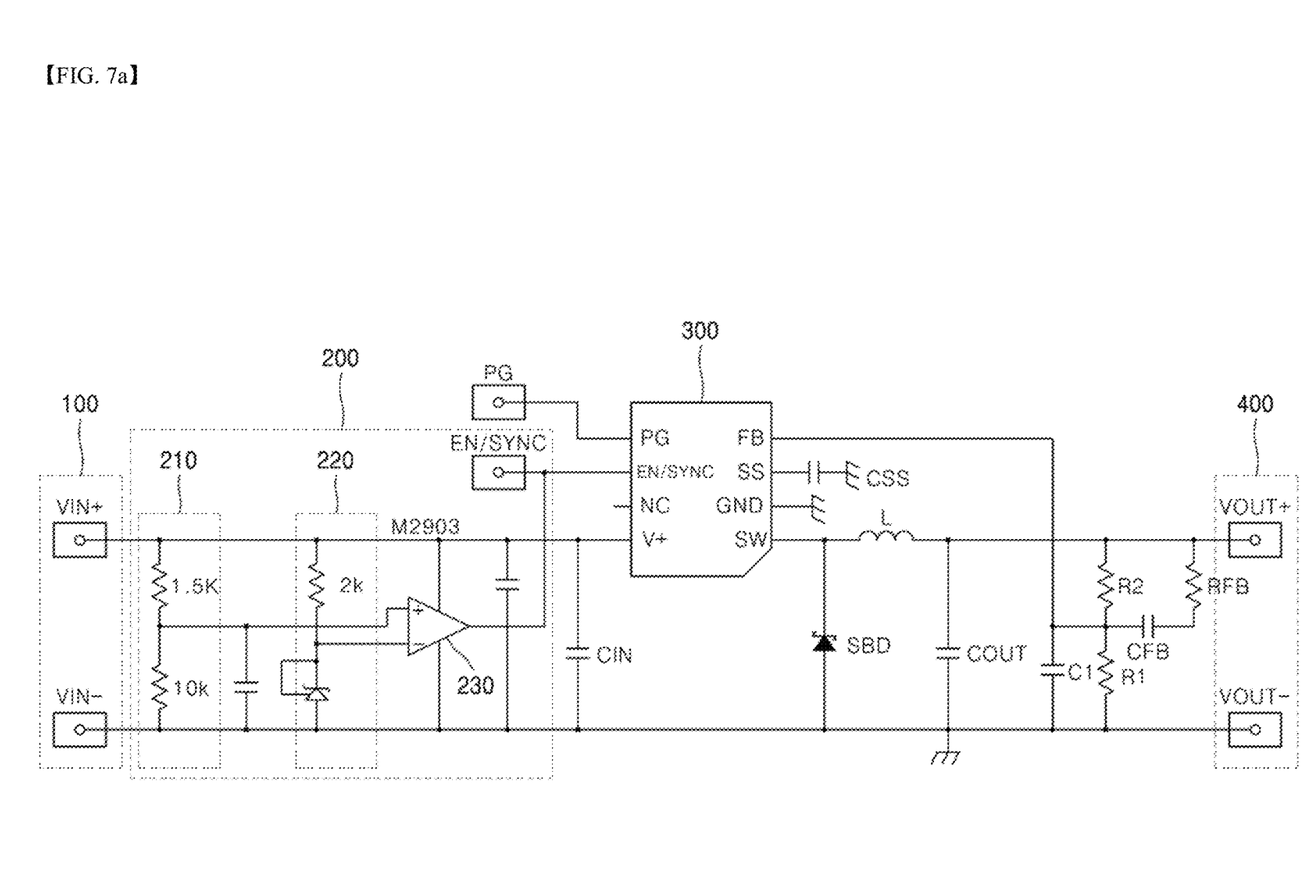
FIGS. 7a and 7b respectively show a circuit diagram of the switcher power converter having the device for eliminating the slope in the output voltage of the switcher power converter of the PLC module according to the embodiment of the present disclosure, and an output voltage waveform in a gradual increase of an input.
Figure 7B:
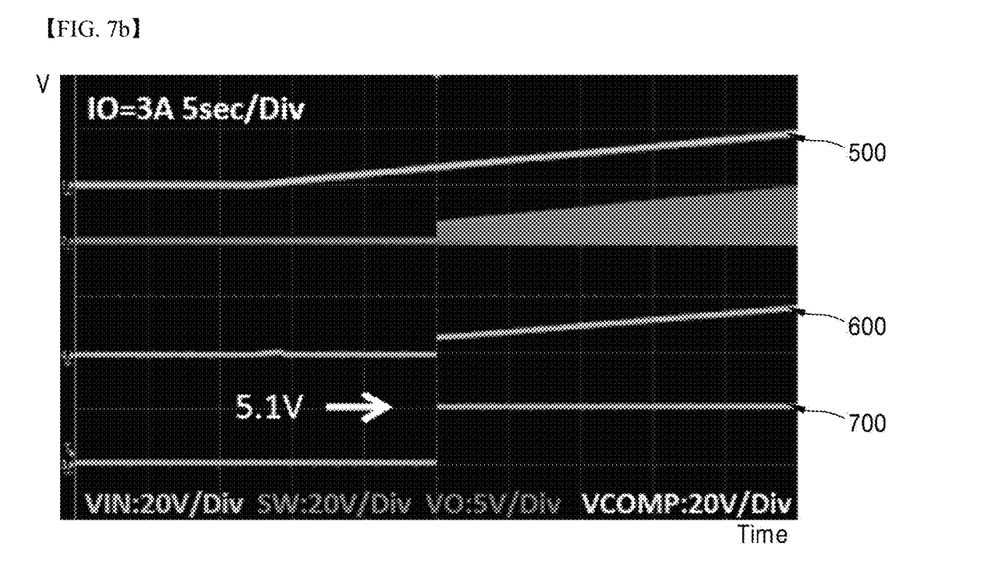

FIGS. 7a and 7b respectively show a circuit diagram of the switcher power converter having the device for eliminating the slope in the output voltage of the switcher power converter of the PLC module according to the embodiment of the present disclosure, and an output voltage waveform in a gradual increase of an input.

Referring to FIGS. 7a and 7b, when the external input voltage 500 which is gradually increased is applied from the input 100 to the input stage distribution unit 210, the external input voltage may be distributed based on an amplification factor controlled by the input stage distribution unit 210 coupled to the input stages VIN+ and VIN− of the input 100.

In this connection, the amplification factor is controlled so that a voltage is generated based on the difference between the input and the output of the regulator 300. Therefore, the amplification factor is adjusted to produce the difference. Therefore, the amplification factor varies depending on the type of the regulator.

The regulator used in FIG. 7a is the NJW4196 step-down regulator available from NJR Corporation. In this case, depending on the regulator characteristic, an amplification factor of 0.4 times should be achieved. In one example, when the regulator is an LM2596 step-down regulator available from Texas Instruments, an amplification factor 1.7 times should be achieved.

Thus, the input stage distribution unit 210 includes the first resistor Ra and the second resistor Rb connected in series with each other. The first resistor Ra is implemented as a resistor of 15 [kΩ] while the second resistor Rb is implemented as a resistor of 10 [kΩ]. As a result, the amplification factor of 0.4 times may be achieved.

The node between the first resistor Ra and the second resistor Rb of the input stage distribution unit 210 is connected to the positive terminal of the comparator as the voltage comparison unit 230. Therefore, the voltage at the node between the first resistor Ra and the second resistor Rb is applied to the positive terminal.

The constant voltage generation unit 220 includes the third resistor Rc and the Zener diode ZD connected in series with each other. The third resistor Rc and the Zener diode ZD are connected to the input stages VIN+ and VIN− of the input 100, respectively. As a result, the gradually increasing external input voltage 500 applied from the input 100 is converted into a constant voltage having a specific voltage value by the constant voltage generation unit 220.

The third resistor Rc and the Zener diode ZD of the constant voltage generation unit 220 are connected to the input 100. The constant voltage generation unit 220 generates a breakdown phenomenon to causes a reverse current to flow when the gradually increasing external input voltage applied from the input 100 exceeds a Zener voltage of the Zener diode ZD. As a result, the input voltage is maintained at a specific voltage value. In FIG. 7a, using NJM1431 as the Zener diode ZD may allow a constant voltage of about 2.44 to 2.49 [V] to be output after the power supply.

The negative terminal of the voltage comparison unit 230 is connected to a node between the third resistor Rc and the Zener diode ZD of the constant voltage generation unit 220. The voltage at the node between the third resistor Rc and the Zener diode ZD of the constant voltage generation unit 220 is applied to the negative terminal of the voltage comparison unit 230.

Even when the gradually increasing external input voltage is applied, the voltage applied to the negative terminal of the voltage comparison unit 230 is maintained at a specific voltage value about 2.44 to 2.49 [V] by the constant voltage generation unit 220. Further, when the gradually increasing external input voltage is applied, the voltage applied to the positive terminal of the voltage comparison unit 230 is gradually increased from and above a value smaller than the specific voltage value about 2.44 to 2.49 [V] held in the negative terminal and based on the amplification factor of the voltage controlled by the input stage distribution unit 210.

In this connection, when the gradually increasing external input voltage is greater than the voltage 2.44 to 2.49 [V] from the constant voltage generation unit 220, the input voltage to the negative terminal of the voltage comparison unit 230 is maintained at a value of 2.44 to 2.49 [V]. Accordingly, the input voltage to the negative terminal of 2.44 to 2.49 [V] will not work in a range below a certain voltage. Further, in a range above the certain voltage, the input voltage to the negative terminal is fixed and held to a constant voltage.

Thereafter, when the external input voltage continuously increases to about 6.5 [V], the voltage value of the input voltage distribution unit 210 applied to the positive terminal of the voltage comparison unit 230 becomes larger than 2.44 to 2.49 [V]. In this case, the output of the voltage comparison unit 230 becomes the external voltage 600 supplied at the time of output. In one example, due to the characteristics of the constant voltage generation unit 220 used in FIG. 7a, a difference 2 [V] between the output voltage and an actual output voltage should occur. Thus, in order for the voltage comparison unit 230 to output an actual output voltage of 5 [V], the external input voltage should increase to reach 7 [V]. However, according to a simulation result, when the external input voltage is about 6.7 [V], the voltage comparison unit 230 outputs an output voltage of 5 [V].

The output voltage of the voltage comparison unit 230 is input to the enable terminal of the regulator 300. Accordingly, the regulator 300 outputs an output voltage DC 5 [V] 700 without a slope phenomenon.

According to the present disclosure, when the external input voltage gradually increases or decreases, the input voltage is output only when the external input voltage is above or equal to the reference voltage. Accordingly, the slope phenomenon occurring at the output voltage of the internal regulator circuit applied to the PLC power supply may be eliminated. Thus, the regulator allows the operation voltage level required by the circuit element to be ensured, and allows the operation timing to be stably provided. Thus, malfunction of the internal circuit may be prevented after the initial voltage application time in the PLC module.

The foregoing descriptions may be subjected to various substitutions, modifications, and alterations within the spirit and scope of the present disclosure, without departing from the spirit of the present disclosure, by those of ordinary skill in the art to which the present disclosure pertains. Accordingly, the scope of the present disclosure is not limited by the above-described embodiments and the accompanying drawings.

What is claimed is:

1. A switcher power converter for a programmable logic controller (PLC) module comprising:
   an input voltage correction unit configured to correct a gradually increasing external input voltage such that the gradually increasing external input voltage is output only when the gradually increasing external input voltage is greater than or equal to a reference voltage; and
   a regulator configured to receive the corrected external input voltage output from the input voltage correction unit and to supply a fixed output voltage to an internal circuit in the PLC module,
   wherein the input voltage correction unit includes:
      an input stage distribution unit including a first resistor Ra and a second resistor Rb connected in series, wherein the first resistor Ra and the second resistor Rb are connected to input stages VIN+ and VIN− respectively;
      a constant voltage generation unit including a third resistor Rc and a Zener diode ZD connected in series with each other, wherein the third resistor Rc and the Zener diode ZD are connected to the input stages VIN+ and VIN− respectively; and
      a voltage comparison unit including a comparator, where the comparator has a positive terminal connected to a node between the first resistor Ra and the second resistor Rb of the input stage distribution unit, and a negative terminal connected to a node between the third resistor Rc and the Zener diode ZD of the constant voltage generation unit,
   wherein the input stage distribution unit changes resistances of the first resistor Ra and the second resistor Rb to control an amplification factor of the external input voltage applied from the input stages to allow the regulator to generate a voltage.

2. The switcher power converter of claim 1,
   wherein the input stage distribution unit is configured to control the amplification factor of the external input voltage to allow the regulator to generate the voltage;
   wherein the constant voltage generation unit is configured to convert the gradually increasing external input voltage into a constant voltage, wherein the constant voltage is not increased beyond a certain voltage value but is kept at the certain voltage value; and
   wherein the voltage comparison unit is configured to, when a voltage output from the input stage distribution unit is greater than a voltage output from the constant voltage generation unit, output the gradually-increasing external input voltage supplied at a current output time.

3. The switcher power converter of claim 1, wherein the constant voltage generation unit converts and maintains the gradually increasing external input voltage applied from the input stages to a specific voltage value based on a Zener voltage of the Zener diode ZD.

4. The switcher power converter of claim 1, wherein the negative terminal of the voltage comparison unit is maintained at a specific voltage value by the constant voltage generation unit,
   wherein the gradually increasing external input voltage is applied to the positive terminal of the voltage comparison unit based on the amplification factor by the input stage distribution unit.

5. The switcher power converter of claim 4, wherein an initial external input voltage applied to the positive terminal of the voltage comparison unit has a voltage value smaller than the specific voltage value held at the negative terminal of the voltage comparison unit.

6. The switcher power converter of claim 4, wherein when a voltage of the positive terminal of the voltage comparison unit is gradually increased to be greater than a voltage of the negative terminal of the voltage comparison unit, the voltage comparison unit outputs, to the regulator, the gradually increasing external input voltage supplied at a current output time.

7. The switcher power converter of claim 6, wherein the external input voltage output from the voltage comparison unit is input to an enable terminal of the regulator.

* * * * *